United States Patent
Kummerl et al.

(10) Patent No.: US 7,256,482 B2
(45) Date of Patent: Aug. 14, 2007

(54) INTEGRATED CIRCUIT CHIP PACKAGING ASSEMBLY

(75) Inventors: Steven Alfred Kummerl, Carrollton, TX (US); Anthony L. Coyle, Plano, TX (US); Bernhard Lange, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 286 days.

(21) Appl. No.: 10/917,036

(22) Filed: Aug. 12, 2004

(65) Prior Publication Data

US 2006/0033185 A1 Feb. 16, 2006

(51) Int. Cl.
*H01L 23/495* (2006.01)
*H01L 23/28* (2006.01)
*H01L 23/48* (2006.01)

(52) U.S. Cl. .................. 257/676; 257/666; 257/696; 257/787; 257/784; 257/E23.047

(58) Field of Classification Search ............... 257/676, 257/675, 696, 666, 787, 784
See application file for complete search history.

(56) References Cited

U.S. PATENT DOCUMENTS

| | | | | |
|---|---|---|---|---|
| 5,536,970 A | * | 7/1996 | Higashi et al. ............ 257/676 |
| 5,814,882 A | * | 9/1998 | Shimada et al. ........... 257/704 |
| 5,998,877 A | * | 12/1999 | Ohuchi ..................... 257/787 |
| 6,075,284 A | | 6/2000 | Choi et al. |
| 6,198,171 B1 | * | 3/2001 | Huang et al. .............. 257/787 |
| 6,427,976 B1 | * | 8/2002 | Huang et al. .............. 257/676 |
| 6,455,348 B1 | * | 9/2002 | Yamaguchi ................ 438/106 |
| 6,498,393 B2 | * | 12/2002 | Fujimoto et al. .......... 257/692 |
| 6,590,281 B2 | * | 7/2003 | Wu et al. ................... 257/684 |
| 6,646,329 B2 | | 11/2003 | Estacio et al. |
| 2003/0189222 A1 | | 10/2003 | Itou et al. |

* cited by examiner

*Primary Examiner*—Nitin Parekh
(74) *Attorney, Agent, or Firm*—Yingsheng Tung; Wade James Brady, III; Frederick J. Telecky, Jr.

(57) ABSTRACT

An integrated circuit chip packaging assembly having a first and second package side. An integrated circuit chip has a substrate side and an active circuit side. The chip includes integrated circuit devices formed on the active circuit side. The active circuit side of the chip is on the first package side. The die pad has at least one runner member extending therefrom, which may be bent toward the first package side. The active circuit side of the chip is attached to the die pad. The die pad is on the first package side relative to the chip. The package mold compound is formed over the die pad, at least part of the chip, and at least part of the runner member(s). At least part of the substrate side of the chip and/or at least part of the runner member(s) may not be covered by the package mold compound.

8 Claims, 7 Drawing Sheets

INTEGRATED CIRCUIT CHIP PACKAGING ASSEMBLY

TECHNICAL FIELD

The present invention generally relates to an integrated circuit chip packaging assembly.

BACKGROUND

Heat dissipation from an integrated circuit (IC) chip or die during operation is typically an important issue, especially as the density of IC devices on a chip continues to increase. Also, many devices now have combinations of high-power transistors and low-power transistors formed on a same chip. Such high-power transistors tend to produce more heat than low-power transistors. Further, more system-on-chip configurations are being used. Thus, there are often a wide variety of IC devices on a same chip. Some of the IC devices can handle and/or put out much more heat than nearby or neighboring devices on the same chip. Hence, the reliability and effectiveness of heat dissipation for a packaged IC chip may greatly affect the reliability and/or performance of an IC chip during operation.

Many conventional die package assemblies have an exposed die pad surface. Typically an IC chip is soldered, bonded, or adhered to a die pad to improve heat transfer from the die via the die pad. In the case of soldering the IC chip to the leadframe, the chip typically has a solderable backside metallization for attachment to the die pad using a high melting temperature solder which is typically lead-based. An exposed die pad is often attached to a heat sink member such as but not limited to a metal feature on a printed circuit board (PCB) to provide a primary heat transfer path from the chip to the heat sink via the die pad. However, in the case of soldering the chip to the leadframe where a high lead alloy is used, it would be desirable to eliminate lead-based alloys from packages. Also, there is a continued need for improved IC chip package designs that provide efficient heat transfer from the chip during operation.

SUMMARY OF THE INVENTION

The problems and needs outlined above may be addressed by embodiments of the present invention. In accordance with one aspect of the present invention, an integrated circuit chip packaging assembly is provided, which includes an integrated circuit chip and a die pad. The integrated circuit chip has a substrate side and an active circuit side. The chip includes integrated circuit devices formed on the active circuit side. The die pad has at least one runner member extending therefrom. The active circuit side of the chip is attached to the die pad.

In accordance with another aspect of the present invention, an integrated circuit chip packaging assembly having a first package side and a second package side, is provided. The assembly includes an integrated circuit chip, a die pad, package leads, and package mold compound. The integrated circuit chip has a substrate side and an active circuit side. The chip includes contact pads and integrated circuit devices formed on the active circuit side. The active circuit side of the chip is on the first package side. The die pad has at least one runner member extending therefrom and bent toward the first package side. The active circuit side of the chip is attached to the die pad. The die pad is on the first package side relative to the chip. The package leads are formed on the second package side. At least some of the package leads are electrically connected to at least some of the contact pads on the chip. The package mold compound is formed over the die pad and at least part of the chip. At least part of the runner member(s) is/are not covered by the package mold compound on the first package side.

In accordance with yet another aspect of the present invention, an integrated circuit chip packaging assembly having a first package side and a second package side, is provided. The assembly includes an integrated circuit chip, a die pad, package leads, and package mold compound. The integrated circuit chip has a substrate side and an active circuit side. The chip includes contact pads and integrated circuit devices formed on the active circuit side. The active circuit side of the chip is on the first package side. The die pad has a runner member or members extending therefrom. The active circuit side of the chip is attached to the die pad. The die pad is on the first package side relative to the chip. The package leads are formed on the second package side. At least some of the package leads are electrically connected to at least some of the contact pads on the chip. The package mold compound is formed over the die pad and at least part of the chip. At least part of the substrate side of the chip is not covered by the package mold compound on the second package side.

In accordance with yet another aspect of the present invention, an integrated circuit chip packaging assembly having a first package side and a second package side, is provided. The assembly includes an integrated circuit chip, a die pad, package leads, and package mold compound. The integrated circuit chip has a substrate side and an active circuit side. The chip includes contact pads and integrated circuit devices formed on the active circuit side. The active circuit side of the chip is on the first package side. The die pad has a runner member or members extending therefrom and bent toward the first package side. The active circuit side of the chip is attached to the die pad. The die pad is on the first package side relative to the chip. The package leads are formed on the second package side. At least some of the package leads are electrically connected to at least some of the contact pads on the chip. The package mold compound is formed over the die pad and at least part of the chip. At least part of the runner member(s) is/are not covered by the package mold compound on the first package side, and at least part of the substrate side of the chip is not covered by the package mold compound on the second package side.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
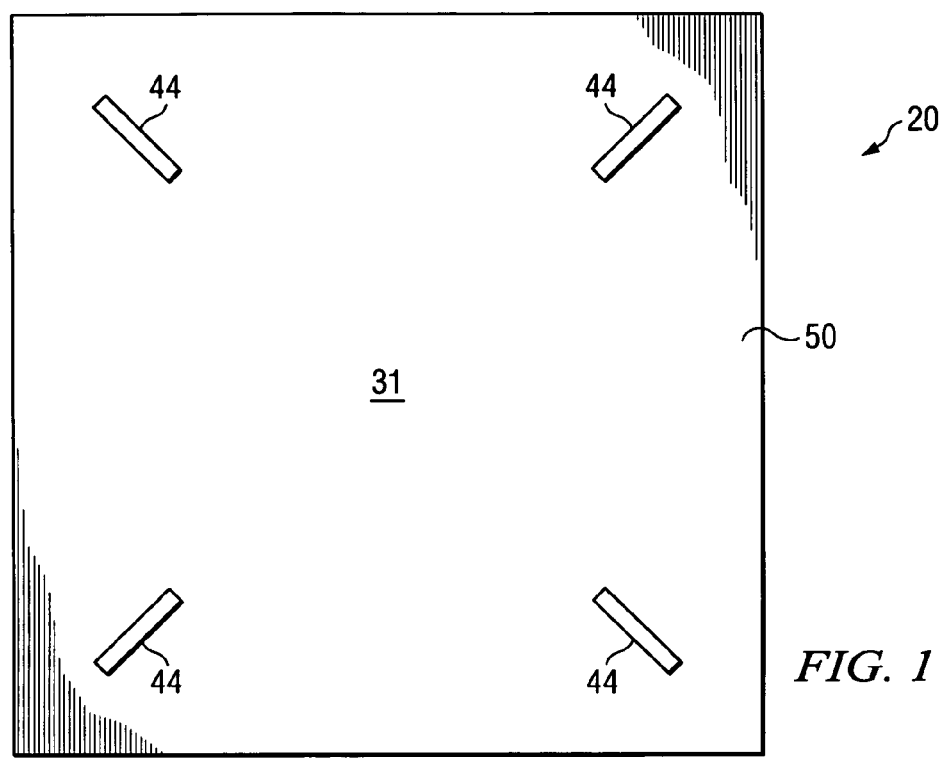
FIG. 1 is a top view showing a first package side of a QFN package assembly of a first illustrative embodiment of the present invention.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a integrated circuit chip packaging assembly 20 having the die pad 24 attached to the active circuit side 26 of the integrated circuit chip 30. FIGS. 1-6 and 9 show various views of a first illustrative embodiment of the present invention. FIGS. 7, 8, and 10-13 show some alternatives embodiments and example variations for embodiments of the present invention. The first embodiment will be described in the context of a QFN package (quad flat non-lead package) by way of example. However, an embodiment of the present invention also may be used for other types and designs of packages.

Figure 2:
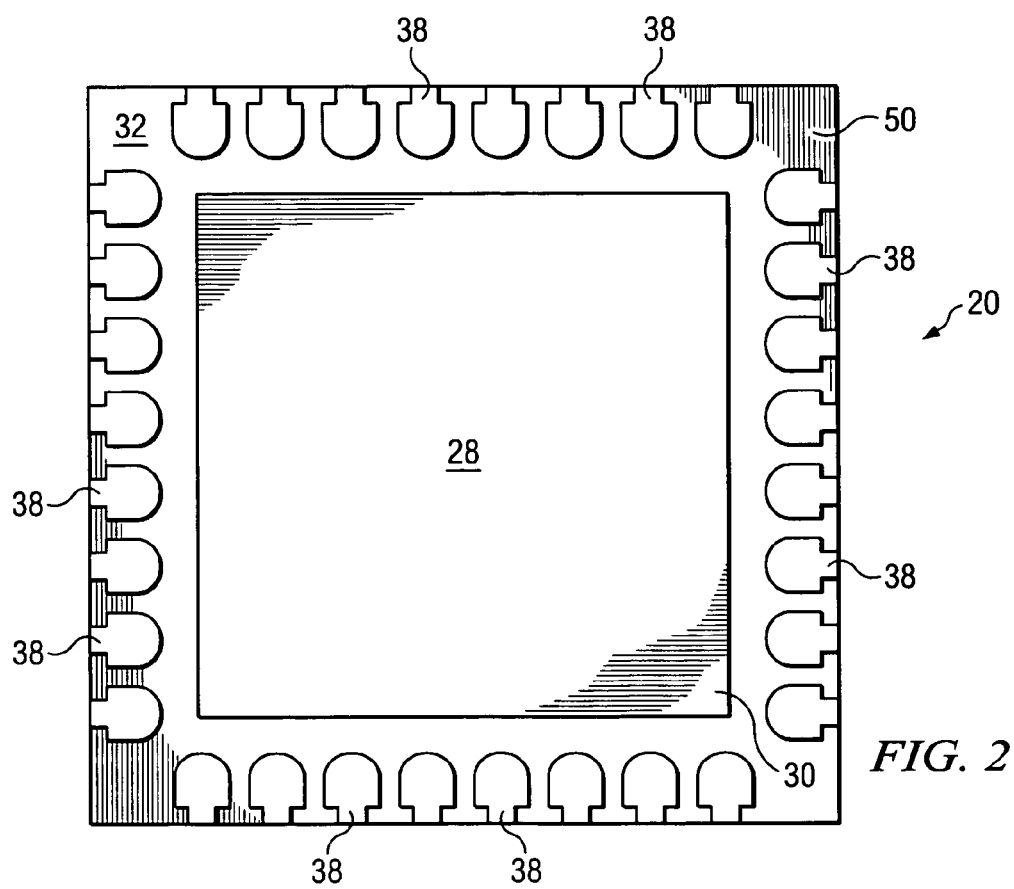
FIG. 2 is a bottom view showing a second package side of the QFN package assembly of the first embodiment.
Figure 3:
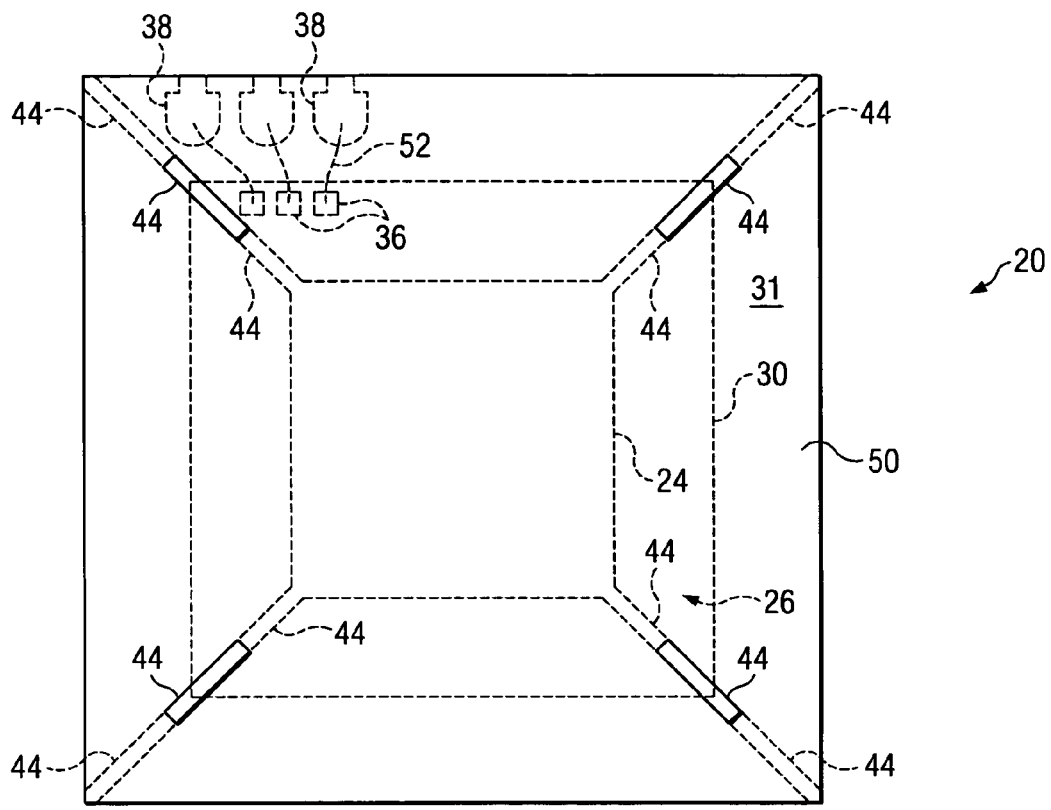
FIG. 3 is another top view showing the first package side of the first embodiment with hidden portions shown in broken lines for purposes of illustration.
Figure 5:
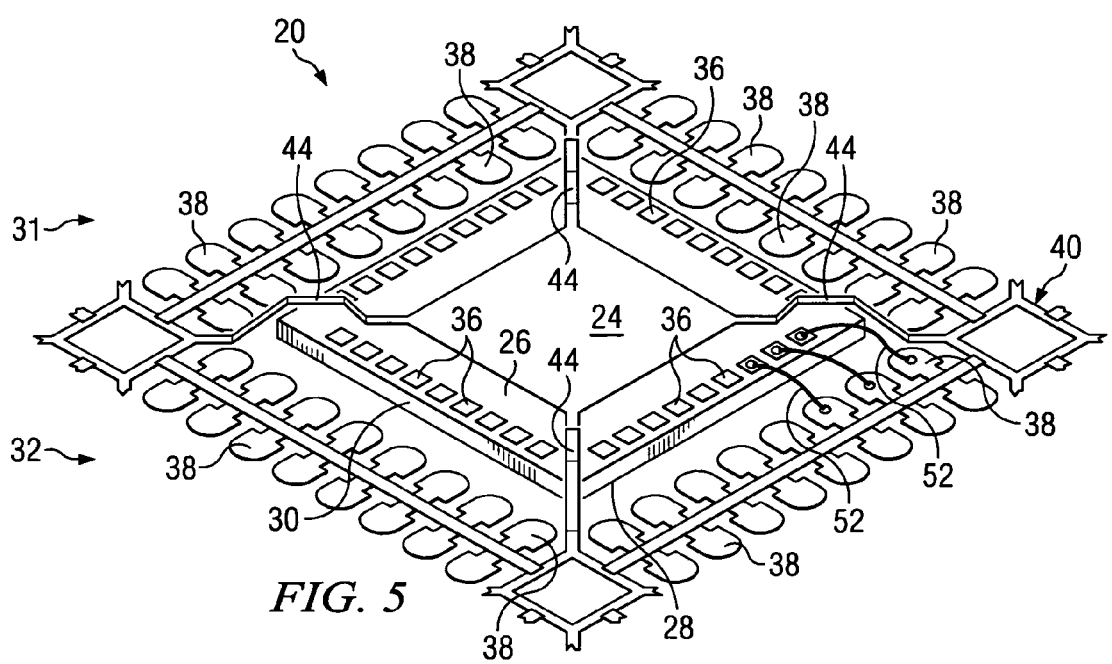
FIGS. 4 and 5 are perspective views illustrating part of a fabrication process for making the first embodiment.
Figure 4:
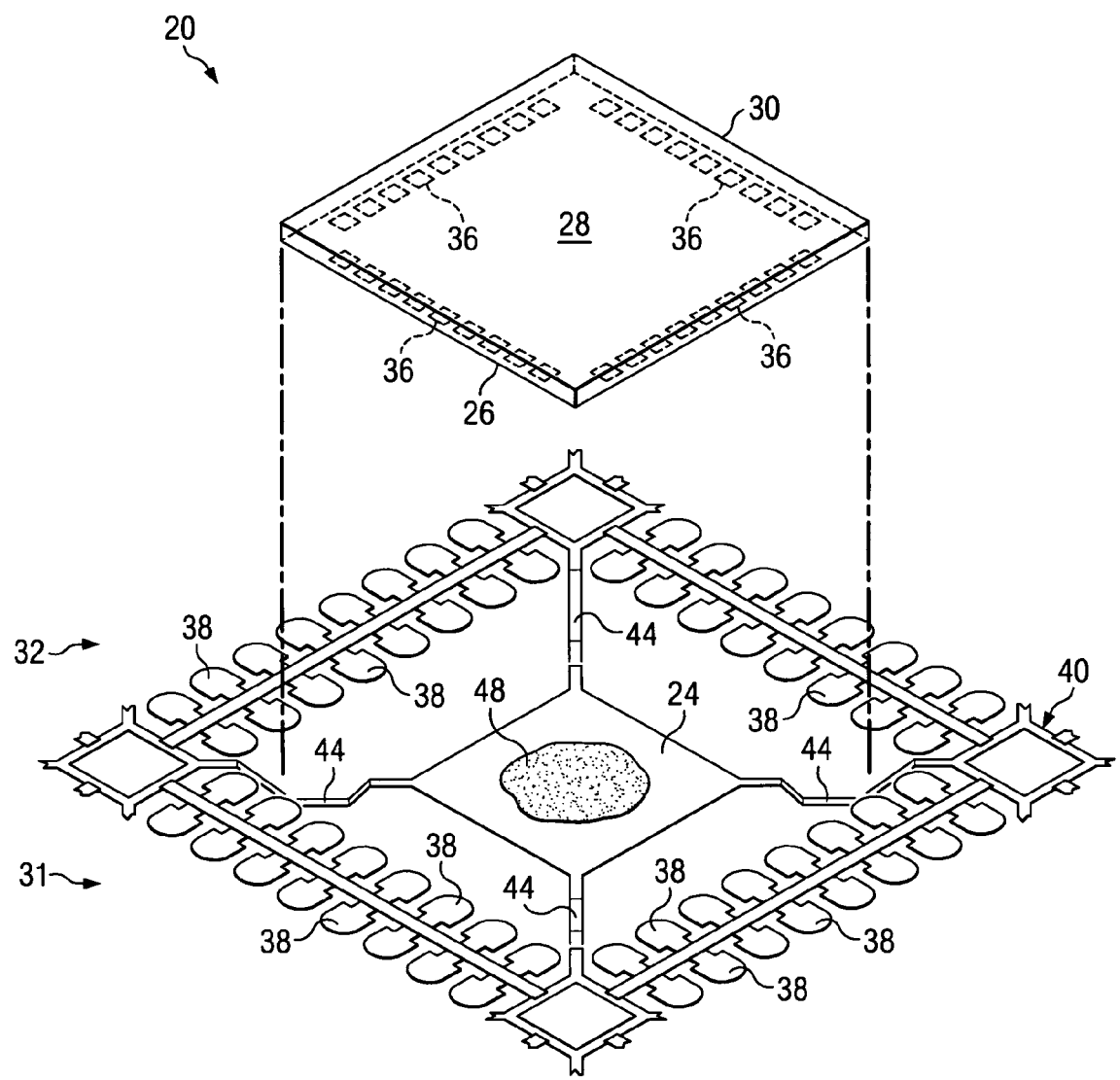
Figure 6:
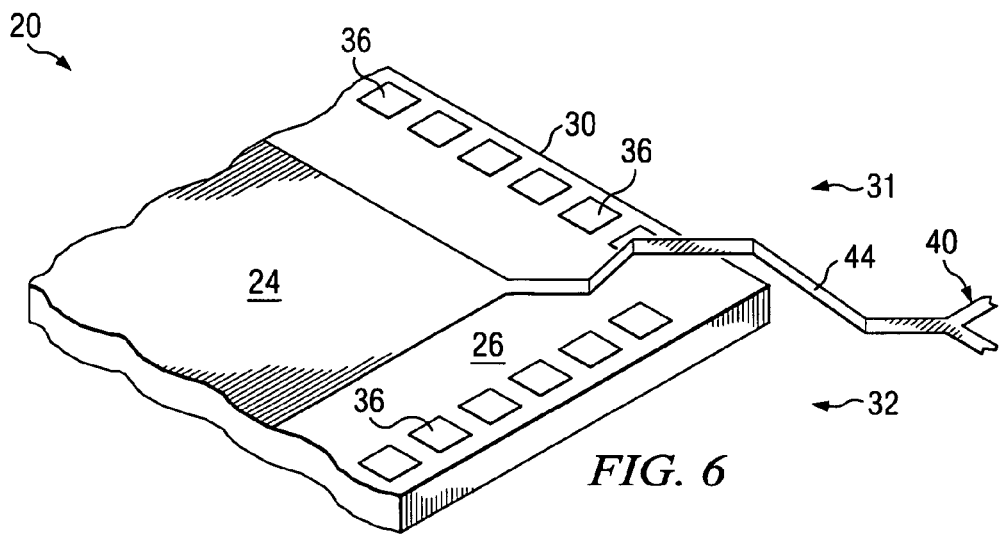
FIG. 6 is a perspective view focusing on a portion of the first embodiment.

Referring to FIGS. 1-6, a first illustrative embodiment of the present invention will be described next. FIG. 1 is a top view showing a first package side 31 of a QFN package assembly 20 of the first embodiment. FIG. 2 is a bottom view showing a second package side 32 of the QFN package assembly 20 of FIG. 1. FIG. 3 is another top view showing the first package side 31 of the first embodiment with hidden portions shown in broken lines for purposes of illustration. FIGS. 4 and 5 are perspective views illustrating a fabrication process for making the assembly 20 of FIGS. 1-3. FIG. 6 is a perspective view focusing on a portion of the first embodiment.

As shown in FIGS. 4 and 5, the assembly 20 of the first embodiment has an integrated circuit chip 30. The chip 30 of the first embodiment has an active circuit side 26 and a substrate side 28. Contact pads 36 and integrated circuit devices are formed on the active circuit side 26 of the chip 30. The integrated circuit devices are not shown in the figures due to their small size and for purposes of simplifying the figures. The integrated circuit devices often will be formed at a central portion of the chip 30, for example, and are at least partially covered by the die pad 24 in this illustrative embodiment.

In FIGS. 4 and 5, the die pad 24 and package leads 38 are shown still attached to and part of a leadframe 40, as is common package manufacturing. The die pad 24 has runner members 44 extending therefrom, which initially (during fabrication) define the position and level of the die pad 24 relative to the package leads 38 in the leadframe 40. As shown in FIGS. 4-6, the runner members 44 of the first embodiment are bent toward the first package side 31. There are several reasons why it may be desirable to have the runner members 44 bent away from the die pad 24, which will be discussed below.

As illustrated in FIG. 4, the active circuit side 26 of the chip 30 is attached to the die pad 24. In a preferred embodiment, the chip 30 is attached to the die pad 24 using an adhesive 48. As shown in FIG. 4, the adhesive 48 may be placed on the die pad 24 prior to placing the chip 30 on the die pad 24. In other methods of making the assembly 20, the adhesive 48 may be placed on the chip 30 and/or the die pad 24. For example, a first part of an adhesive compound may be placed on the chip 30 and a second part of the adhesive compound may be placed on the die pad 24, so that when combined (i.e., when the chip 30 is placed on the die pad 24) the adhesive compound is mixed, activated, and cured.

Note in FIGS. 4 and 5 that the active circuit side 26 of the chip 30 is on the first package side 31 of the assembly 20 and that the die pad 24 is on the first package side 31 relative to the chip 30 (see also FIG. 3). In conventional packaging assemblies, the die pad 24 is typically attached to the substrate side 28 of the chip 30. Also note that in many conventional packaging assemblies, the die pad 24 is exposed (not covered by package mold compound). In the first embodiment, the substrate side 28 of the chip 30 is exposed (not covered by package mold compound 50) (see FIG. 2), and the die pad 24 is covered by the package mold compound 50 (see FIG. 3). In the first embodiment, the runner members 44 are bent such that the die pad 24 is offset from the package leads 38 and so that the substrate side 28 of the chip 30 is generally along a same plane as the package leads 38. This allows the package leads 38 and the substrate side 28 of the chip 30 to be exposed and substantially co-planar in the finished assembly 20, as shown in FIG. 2. The benefits of this configuration will be discussed below.

Because the integrated circuit devices on the active circuit side 26 of the chip 30 may be at least partially covered by the die pad 24, which is typically metal, it may be preferred to cover the integrated circuit devices with a passivation layer and/or a dielectric layer to prevent shorting to the die pad 24. Also, or alternatively, it may be preferred to use a non-conductive adhesive 48 to attach the chip 30 to the die pad 24. For heat transfer from the integrated circuit devices to the die pad 24, it may be preferred to use an adhesive 48 with good thermal conductivity (that may or may not be electrically conductive). For example, a silver filled adhesive 48 may be used to attach the chip 30 to the die pad 24 to provide a good thermal path from the integrated circuits to the die pad 24. Many adhesives that have higher thermal conductivity are inherently electrically conductive, which may cell for the need of a dielectric layer covering the integrated circuit devices on the active circuit side 26 of the chip 30. It is contemplated that a non-electrically-conductive adhesive 48 may be used in an embodiment of the present invention, while still providing adequate heat transfer to the die pad 24.

It is preferred that the adhesive 48 is thicker than the height of the integrated circuit devices and conformal to the structures and surface of the integrated circuits to avoid or prevent air voids and to improve the thermal path between the chip 30 and the die pad 24. An advantage of using an adhesive 48 to attach the chip 30 to the die pad 24 is that it may eliminate the need for a high temperature (e.g., 340 degrees Celsius) cycle for attaching the chip 30 to the die pad 24 using solder. Also, such high temperature solders (which typically need to withstand reflow temperatures later when attaching the package assembly to a PCB) are often lead bearing alloys. It is desirable to eliminate lead from processes and products where possible (e.g., for environmental and safety reasons). Thus, an embodiment of the present invention may eliminate the need for an intermediate alloy (that is likely lead bearing) to bond the chip 30 to the die pad 24 as is currently done with some direct solder attach processes. In an embodiment of the present invention, the chip 30 may be attached to the die pad 24 using any of a wide variety of ways, including (but not limited to): dispensed adhesive, two-part adhesive, liquid adhesive, epoxy, silver epoxy, non-electrically-conductive adhesive, electrically-conductive adhesive, LOC (lead-on-chip) tape, adhesive tape, solder, adhesive film, and combinations thereof, for example.

In FIG. 4, the second package side 32 is on top and the chip 30 is placed over the die pad 24. After securing the chip 30 to the die pad 24, the partial assembly 20 may be flipped so that the first package side 31 is on top and the die pad 24 is located over the chip 30, as shown in FIG. 5. In the first embodiment, at least some of the contact pads 36 on the chip 30 are electrically connected to at least some of the package leads 38 by a wire 52 using a wire bonding process. A currently-known or future-developed wire bonding process may be used to form the wires 52 connecting between contact pads 36 and package leads 38. In FIG. 5, just a few of the wires 52 are shown for purposes of illustration. Although wire bonding is shown in the first embodiment, it should be noted that any currently-known or future-developed chip attachment process (e.g., solder balls, solder bumps, conductive adhesive, pins, bonding, welding, etc.) may be used in an embodiment of the present invention.

Typically after the wire bonding process, the package mold compound 50 (e.g., plastic, thermally conductive plastic compound, ceramic, etc.) will be formed over the contact pads 36 and wires 52 for protection. Then after the package mold compound 50 is formed, the leadframe 40 is cut and the assembly is trimmed (e.g., deflashed) as needed to form the final assembly 20 shown in FIGS. 1-3. The first package side 31 of the completed assembly of the first embodiment is shown in FIG. 3. And in FIG. 3, the die pad 24, covered portions of the runner members 44, the active circuit side 26 of the chip 30, the chip contact pads 36, a few of the wires 52, and covered sides of a few of the package leads 38, are shown in broken lines because they are covered by the package mold compound 50.

As shown in FIGS. 1 and 3, part of the runners members 44 are not covered by the package mold compound 50 on the first package side 31 of the assembly 20 in the first embodiment. These exposed portions of the runner members 44 can aid in extracting heat out of the chip 30 by providing another heat transfer path. For example, the exposed portions of the runner members 44 may act as heat radiators themselves. Alternatively, the exposed portions of the runner members 44 may be attached to a heat sink or larger radiator member (e.g., by adhesive or solder) to provide more cooling for the chip 30. Furthermore, one or more of the runner members 44 may be electrically connected to another part or to a ground, for example.

For the first embodiment, as shown in FIG. 2, at least part of the substrate side 28 of the chip 30 is not covered by the package mold compound 50 on the second package side 32. As is commonly done with exposed die pads in conventional chip package assemblies, the substrate side 28 of the chip 30 may be attached to or in thermal contact with a printed circuit board (PCB) and/or a heat sink member. The substrate side 28 of the chip 30 may be attached to a PCB or a heat sink member by any of a wide variety ways, including (but not limited to): tape, adhesive, bonding, solder, or combinations thereof, for example. If it is desired to attach the substrate side 28 of the chip 30 to a heat sink member using solder, for example, it may be desirable to add a metallization layer on the substrate side 28 of the chip 30. Also, a metallization layer on the substrate side 28 of the chip 30 may be preferred for other attachment methods as well. Such metallization layer may be added to the substrate side 28 of the chip 30 while making the chip 30, while making the packaging assembly 20, just before attaching the assembly 20 to a PCB, or at any other stage, for example. If the substrate side 28 of the chip 30 is attached to a heat sink member and/or a PCB by an adhesive, for example, there may not be a need for a metallization layer. Thus, an embodiment of the present invention may or may not have a metallization layer formed on the substrate side 28 of the chip 30.

In conventional packaging assemblies where the die pad 24 is attached to the substrate side 28 of the chip 30 and the die pad is exposed to provide a primary heat transfer path from the chip, the heat must travel from the chip through the die pad to the heat sink. In the first embodiment, the heat can flow directly from the chip 30 to an attached heat sink, which may provide a more efficient thermal path and improved cooling. Also, in the first embodiment, it may be beneficial to have the die pad 24 in thermal contact with chip 30 closer to the integrated circuit devices for extracting heat away the integrated circuit devices via the die pad 24 and runner members 44. Thus, an embodiment of the present invention may provide better thermal paths and more efficient cooling for the integrated circuit devices than conventional packaging designs.

FIG. 2 also shows that at least some of the package leads 38 are exposed on the second package side 32 in the first embodiment. Note that other package lead types, placements, and/or configurations may be used in other embodiments of the present invention (e.g., solder balls, bumps, legs, pins, etc.).

Although at least part of the substrate side 28 of the chip 30 is not covered by the package mold compound 50 in the first embodiment, the substrate side 28 of the chip 30 may be covered more, less, or completely by the package mold compound 50 in other embodiments. Also, the runner members 44 of other embodiments may be covered more, less, or completely by the package mold compound 50.

Having the runner members 44 bent away from the chip 30 allows the runner members 44 to clear portions of the chip 30 (e.g., edge of chip, contacts, integrated circuit devices). Also, the various bends in the runner members 44 allow for the position or level of the die pad 24 to be varied relative to other portions on the leadframe 40. All of the runner members 44 in an embodiment need not be the same and/or symmetric. For example, one or more runner members 44 may have different shapes and/or bends than one or more other runner members 44 in an embodiment. Typically, the die pad 24 and the runner members 44 will be formed from a same sheet of material (e.g., metal) as the package leads 38 in a common leadframe 40. However, it is contemplated the die pad 24 and/or the runner members 44 may be made from different materials than the package leads 38 or may be coated, covered, or layered with a material not present on the package leads 38. For example, the die pad 24 may be covered (partially or completely) with a dielectric material to prevent it from shorting with the integrated circuit devices on the active circuit side 26 of the chip 30.

Figure 7:
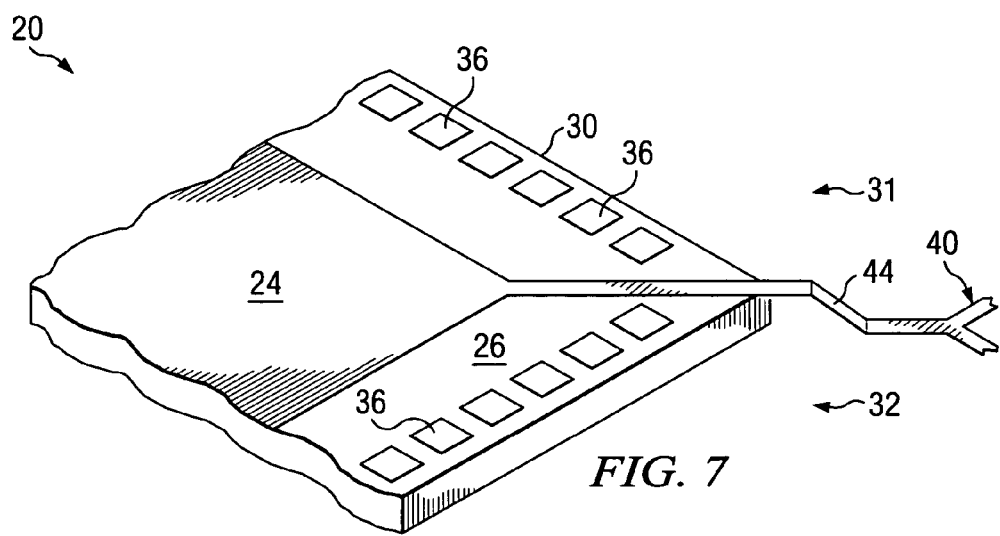
FIGS. 7 and 8 are perspective views showing alternative runner member designs.

Although the runner members 44 are bent toward the first package side 31 in the first embodiment (see e.g., FIG. 6), one, some, or all of the runner members 44 may be bent differently in other embodiments. For example, FIG. 7 shows an alternative runner member design for an embodiment where a runner member 44 is not bent toward the first package side 31 (relative to the die pad 24).

Figure 8:
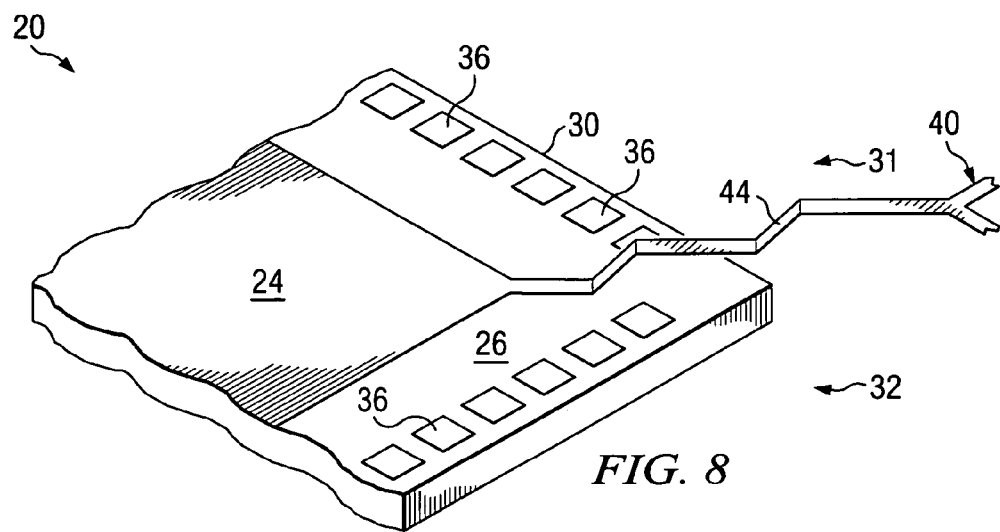

As another example, FIG. 8 shows another alternative runner member design for a second embodiment of the present invention, where a runner member 44 is bent toward the first package side 31. In the second embodiment, the package leads (not shown in FIG. 8) may be on the first package side 31 rather than on the second package side 32. Alternatively, the package leads may be of a different type (e.g., legs extending from the sides of the package assembly 20) than those of the first embodiment.

Figure 9:
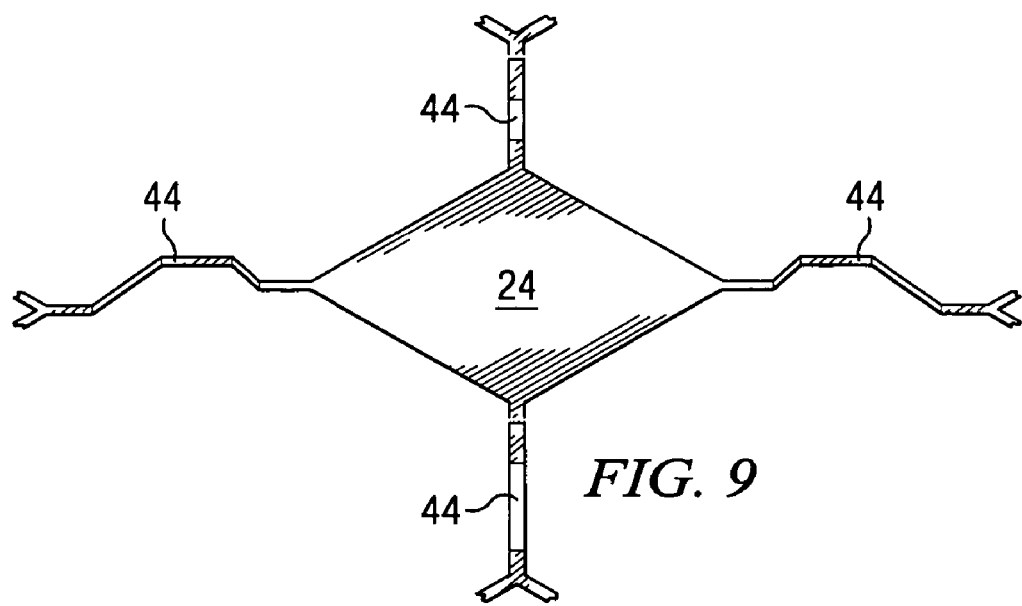
FIG. 9 shows a top view of the die pad and runner members of the first embodiment.
Figure 10:
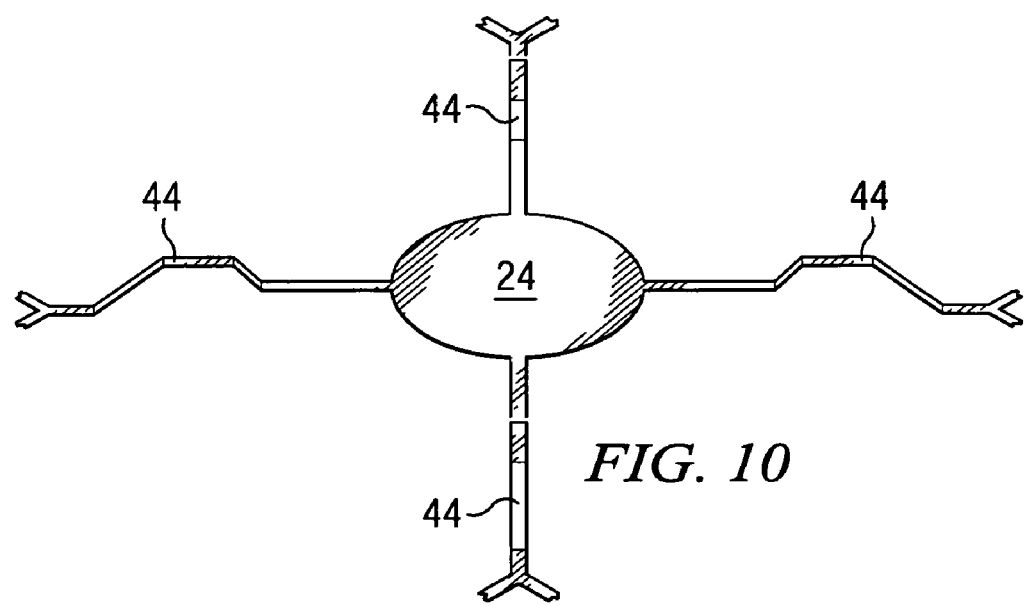
FIGS. 10, 11A, and 11B show some variations for die pad shapes that may be incorporated into an embodiment of the present invention.
Figure 11A:
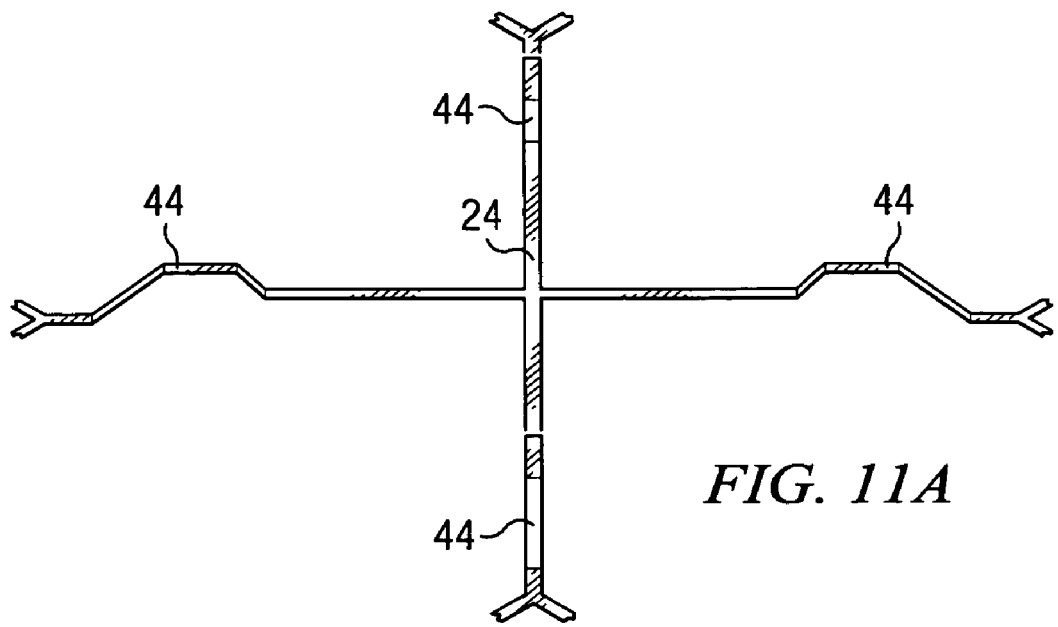
Figure 11B:
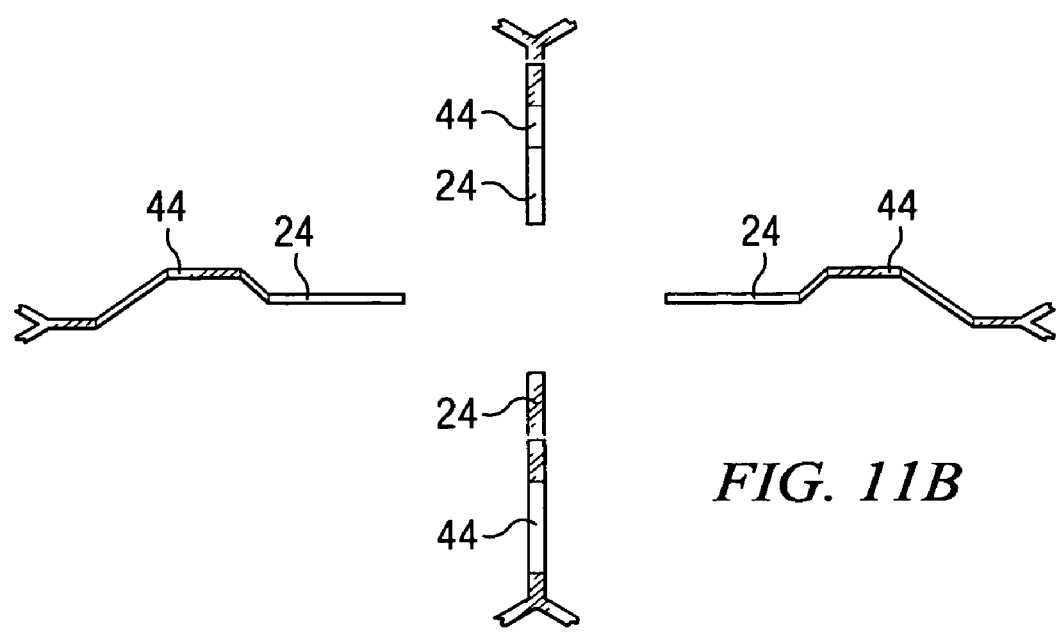

FIG. 9 shows a top view of the die pad 24 and runner members 44 of the first embodiment. Although the die pad 24 of the first embodiment has a square shape with four symmetric runner members 44, the die pad of other embodiments may be different. For example, FIGS. 10 and 11A show two possible variations (among many) for die pad shapes that may be incorporated into an embodiment of the present invention. In FIG. 10, the die pad 24 has a round shape, and an X-shaped die pad 24 is shown in FIG. 11A. FIG. 11B shows yet another possible variation for an embodiment of the present invention having multiple discontinuous die pad portions 24 for supporting the chip. For other embodiments (not shown), the die pad or die pads may have other shapes, sizes, and configurations beyond the few examples shown herein.

The die pad shape may be chosen to clear or avoid covering certain portions (e.g., integrated circuit devices, contact pads 36) of a chip 30, for example. Furthermore, the number and placement of the runner members 44 may be different in other embodiments of the present invention. Although not shown, an embodiment of the present invention may have only one runner member 44. Furthermore, an embodiment may have two, three, five, six, eight, or any number of runner members 44 of same or varying shapes, for example.

Figure 12:
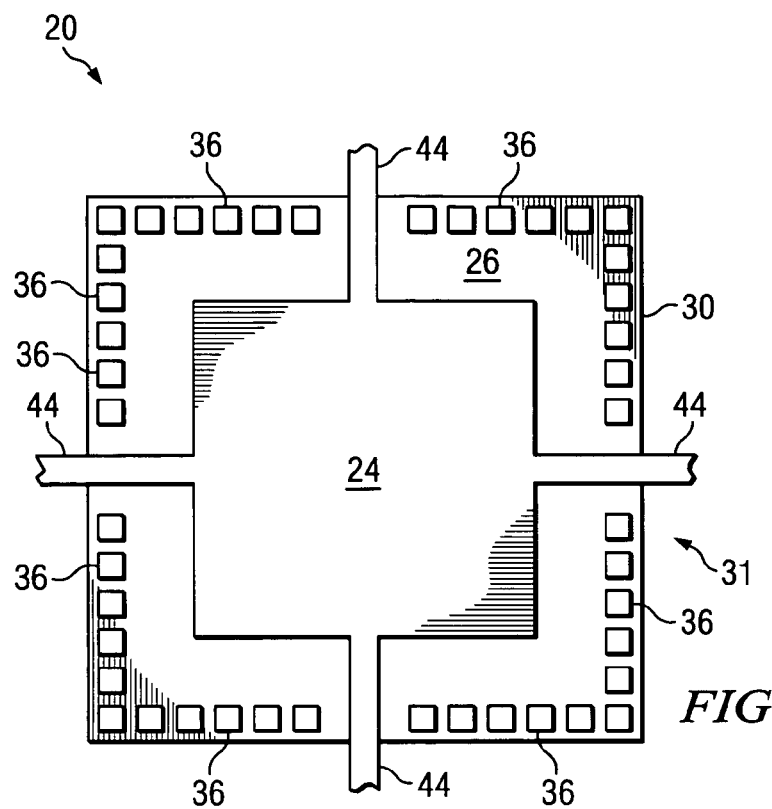
FIG. 12 shows a die pad attached to a chip for a third illustrative embodiment of the present invention.

FIG. 12 shows a die pad 24 attached to a chip 30 for a third illustrative embodiment of the present invention. The remaining portions of the assembly 20 are not shown in FIG. 12 for purposes of illustration. In the third embodiment, the runner members 44 are not bent over the chip 30 and extend across the chip surface along with the die pad 24. Also, note that the runner members 44 of the third embodiment extend along different positions than those of the first embodiment to clear the contact pads 36 of the chip 30, which are also configured differently in the third embodiment. That is, the contact pads 36 on the chip 30 in FIG. 12 are not positioned at the central portions of each side, but rather extend to the corners of the chip 30.

Figure 13:
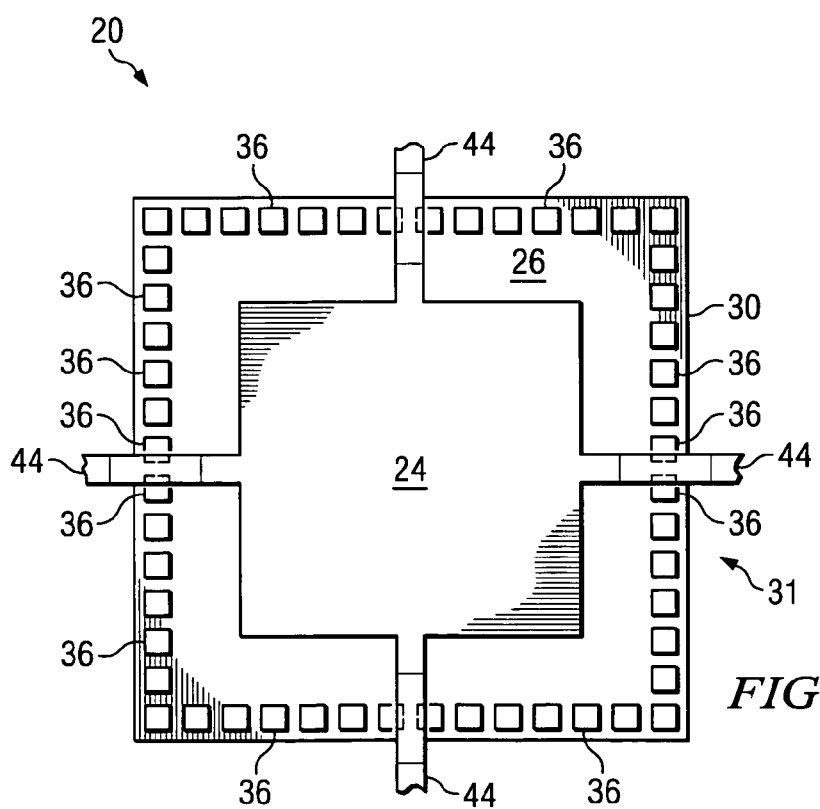
FIG. 13 shows a die pad attached to a chip for a fourth illustrative embodiment of the present invention.

FIG. 13 shows a die pad 24 attached to a chip 30 for a fourth illustrative embodiment of the present invention. The remaining portions of the assembly are not shown in FIG. 13 for illustrative purposes. In the fourth embodiment, the runner members 44 are bent over the chip 30 and extend over contact pads 36. In the fourth embodiment, the contact pads 36 extend around the entire perimeter of the chip 30. Hence, the third and fourth embodiments illustrate some other possible variations (among many) for an embodiment of the present invention, and illustrate how the design of the die pad 24 and/or runner members 44 may be varied to be compatible with the contact pad configuration of a chip 30.

An embodiment of the present invention also may be used for providing multi-chip modules (e.g., multiple chips on each side of the die pad 24), stacked chips, and/or stacked package assembly configurations. This may entail creating several active area die attach pads 24 for each chip 30 or group of chips, for example.

An embodiment of the present invention may provide a number of advantages, including (but not necessarily limited to):

More efficient heat transfer out of the package assembly;

Ability to eliminate an intermediate metal based alloy to attach the chip to the die pad as the primary heat transfer medium (in many prior designs), which is commonly lead based in typical solder;

Ability to provide a lead-free package assembly because the need for a high-lead-content alloy may no longer be needed;

Ability to avoid a high temperature step associated with melting a high-lead alloy that may damage integrated circuit devices on the chip;

Ability to implement an embodiment of the present invention without requiring new processes or equipment, and/or without requiring new chip designs;

Where the substrate side of the chip is exposed and has a metallization layer formed thereon, the chip may be soldered directly to the heat sink and/or PCB using solder deposited during a surface mount process at the end customer site; and Ease of incorporating an embodiment of the present invention into current package lead configurations (e.g., QFN package configuration) using current chip designs/rules.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit chip packaging assembly having a first package side and a second package side, the assembly comprising:
   an integrated circuit chip having a substrate side and an active circuit side, the chip comprising contact pads and integrated circuit devices formed on the active circuit side, wherein the active circuit side of the chip faces the first package side; and
   a die pad attached to the active circuit side of the chip, the die pad being towards the first package side relative to the chip;
   runner members extending from four corners of the die pad and bent toward the first package side;
   package leads formed on the second package side, at least some of the package leads being electrically connected to at least some of the contact pads on the chip, wherein the package leads and the substrate side of the integrated circuit chip are coplanar; and
   package mold compound formed over the die pad and at least part of the chip, wherein at least part of the runner member is not covered by the package mold compound on the first package side.

2. The integrated circuit chip packaging assembly of claim 1, wherein at least part of the substrate side of the chip is not covered by the package mold compound on the second package side.

3. The integrated circuit chip packaging assembly of claim 2, wherein the substrate side of the chip has a metallization layer formed thereon.

4. The integrated circuit chip packaging assembly of claim 1, wherein at least some of the package leads are electrically connected to at least some of the contact pads on the chip by wires.

5. An integrated circuit chip packaging assembly having a first package side and a second package side, the assembly comprising:
   an integrated circuit chip having a substrate side and an active circuit side, the chip comprising contact pads and integrated circuit devices formed on the active circuit side, wherein the active circuit side of the chip faces the first package side;
   a die pad attached to the active circuit side of the chip, the die pad being towards the first package side relative to the chip;
   runner members extending from four corners of the die pad and bent toward the first package side;
   package leads formed on the second package side, at least some of the package leads being electrically connected to at least some of the contact pads on the chip, wherein the package leads and the substrate side of the integrated circuit chip are coplanar; and
   package mold compound formed over the die pad and at least part of the chip, wherein at least part of the substrate side of the chip is not covered by the package mold compound on the second package side.

6. The integrated circuit chip packaging assembly of claim 5, wherein the runner member extends from the die pad and is bent toward the first package side.

7. The integrated circuit chip packaging assembly of claim 6, wherein at least part of the runner member is not covered by the package mold compound on the first package side.

8. The integrated circuit chip packaging assembly of claim 5, wherein the substrate side of the chip has a metallization layer formed thereon.

* * * * *